United States Patent [19]

Wright et al.

[11] E Re. 30,395

[45] Reissued Sep. 2, 1980

[54] 2½D CORE MEMORY

[75] Inventors: Kurt O. Wright, Burbank; Thomas J. Gilligan, Rolling Hills Estates, both of Calif.

[73] Assignee: Ampex Corporation, Redwood City, Calif.

[21] Appl. No.: 3,718

[22] Filed: Jan. 15, 1979

Related U.S. Patent Documents

Reissue of:

[64] Patent No.: 4,096,583
Issued: Jun. 20, 1978
Appl. No.: 732,928
Filed: Oct. 15, 1976

[51] Int. Cl.[2] ..... G11C 11/00
[52] U.S. Cl. ..... 365/130
[58] Field of Search ..... 365/130, 69

[56] References Cited

U.S. PATENT DOCUMENTS

| | | | |
|---|---|---|---|
| 3,181,129 | 4/1965 | Freedman | 365/239 |
| 3,466,630 | 9/1969 | Mayne et al. | 340/174 |
| 3,466,633 | 9/1969 | Gilligan et al. | 365/243 |
| 3,484,763 | 12/1969 | Genke et al. | 365/191 |
| 3,500,359 | 3/1970 | Hsieh et al. | 365/191 |
| 3,587,068 | 6/1971 | Strawbridge | 340/347 R |

OTHER PUBLICATIONS

"Novel Low Cost Design for 2½D Storage Systems", Harding et al., Bell Telephone Lab. Inc. 1968.
"Novel Low Cost Design for 2½D Storage Systems", Harding et al., International Solid-State Circuits Conference, 2/67.
"A 2.5D Ferrite Memory Sense Amplifier", Patel et al., IEEE Journal of Solid State Circuits, vol. SC-1, #1 Sep. 66.
"20 Million Bir High Speed Core Memory", Norman, Computer Design pp. 54–60, Dec. 67.
"First-and Second-Order Ferrite Memory Core Characteristics and Their Relationship to System Performance", J.R. Brown, Jr., IEEE Transactions on Electronic Computers, pp. 485–501, 8/66.
"Ferrite-Core Memories", R. A. Hill, Electronics World, Oct. 1970, pp. 49–52.
"2½D High Speed Memory Systems-Past, Present & Future," T. J. Gilligan, IEEE Trans. on Computers, vol. EC-15 #4, 8/66.

*Primary Examiner*—Vincent P. Canney
*Attorney, Agent, or Firm*—Robert G. Clay; Gregory L. Roth

[57] ABSTRACT

A large, 2 wire, 2½D core memory includes four, 1K (1024) by 1280, core frames with 1280 Y conductors each stringing and inductively coupling a column of 1024 cores in each of the four frames and 4K orthogonal X conductors each stringing and inductively coupling one row of 1280 cores. A word position within the memory is defined by 5 pairs of Y conductors, a corresponding X conductor from each frame, and selection of relative current directions in the Y conductors. Reading of a 20 bit word is accomplished with 5 sense amplifiers in four rapid sucession read sub-operations. Writing is accomplished in two sub-operations by separately controlling partial select digit currents in each of the 5 pairs of Y conductors. A bidirectional X drive and switching arrangement utilizes overlapping X drive currents and shared circuitry to maximize memory speed and reduce electronic components costs.

43 Claims, 11 Drawing Figures

| |
|---|
| FIG. 6A |
| FIG. 6B |
| FIG. 6C |

2½D CORE MEMORY

Matter enclosed in heavy brackets [ ] appears in the original patent but forms no part of this reissue specification; matter printed in italics indicates the additions made by reissue.

BACKGROUND OF THE INVENTION

1. Field of the Invention

This invention relates to large capacity 2 wire core memories and more particularly to such memories which internally perform serial data cycles with overlapping drive currents and which have shared drive circuitry.

2. Description of the Prior Art

Two wire, 2½D core memories utilize two oppositely oriented cores for each intersection of an X current and a Y current pair. The direction and relative polarities of the three partial select currents determine which of the two cores is selected and the polarity of the resulting EMF switching force. The X current adds to a Y current at the selected core and cancels the other Y current at the unselected core of an oppositely oriented core pair.

Two wire, 2D memories have the advantage of reducing stack wiring costs in comparison to three wire, 3D memories, but this advantage is typically overshadowed by increased costs for current matrix and sense circuitry. The 2½D memory organization helps to reduce the cost of the electronics relative to 2D memory configurations but heretofore has not been sufficient to make the arrangement competitive with three wire 3D arrangements.

SUMMARY OF THE INVENTION

A large two wire core memory in accordance with the invention includes four 1K by 1280 2½D memory core frame matrices with 1280 Y conductors inductively coupled to a column of cores in each matrix. Each of 4K X conductors inductively couples only one row of cores in one core frame matrix. Control and sense circuitry functions to select five pairs of Y conductors or a total of 10 conductors from among the 1280 Y conductors and a corresponding X conductor in each matrix. The 40 cores thus identified are reduced to a 20 bit word by proper selection of the X current polarity in conjunction with the oppositely oriented core pair 2½D core configuration.

Reading is accomplished in four rapid sequence read subcycles as 5 sense amplifiers each sense core output switching pulses differentially across a pair of Y conductors continuously carrying currents, while a corresponding X conductor of each frame is sequentially energized with a partial select read current. One X conductor is energized during each of the four rapid sequence subcycles. The 4 sequential sets of read data signals from the five sense amplifiers are stored in 4 bit parallel in-parallel out shift registers for assembly as either two 10 bit parallel data bytes or one 20 bit parallel data word. Pairs of X currents are overlapped during sequential read subcycles to permit an increased read subcycle rate by initiating the X current for subcycle 2 while the X current for subcycle 1 continues. The X currents for subcycle 1 and 2 terminate simultaneously at the end of read subcycle 2. A single X read current is generated for subcycle 3 and continues as another X read current for read subcycle 4 is generated. The X read currents for subcycles 3 and 4 terminate simultaneously.

A write portion of a memory cycle is accomplished with each current of the selected five pairs of Y currents being individually controlled in accordance with data information stored in the data shift registers, during each of two time sequential memory write subcycles. During the first write subcycle two corresponding X currents are simultaneously energized, one in each of two frames. Each X current is additive at an addressed core location with a different current (if present) from each Y conductor pair and cancels the other current of each Y conductor pair. During the second write subcycle the two other X currents are energized in the other two frames and the selected 10 Y currents are responsive to the remaining 10 bits of the data word.

Current control circuitry for the X conductors uses a special shared driver and sink switching arrangement which greatly reduces the cost of the electronics. By organizing the two sets of driver switches to control frames 0,2 and 1,3 while the two sets of sink switches control frames 0,1 and 2,3, an inherent self-encoding is provided and two, opposite polarity X currents can be generated simultaneously. To further reduce costs, the two sets of X drive switches are arranged in a special decoding matrix for selection in response to address signals and timing and polarity signals.

BRIEF DESCRIPTION OF THE DRAWINGS

A better understanding of the invention may be had from a consideration of the following detailed description, taken in conjunction with the accompanying drawings, in which.

DETAILED DESCRIPTION

Figure 1A:
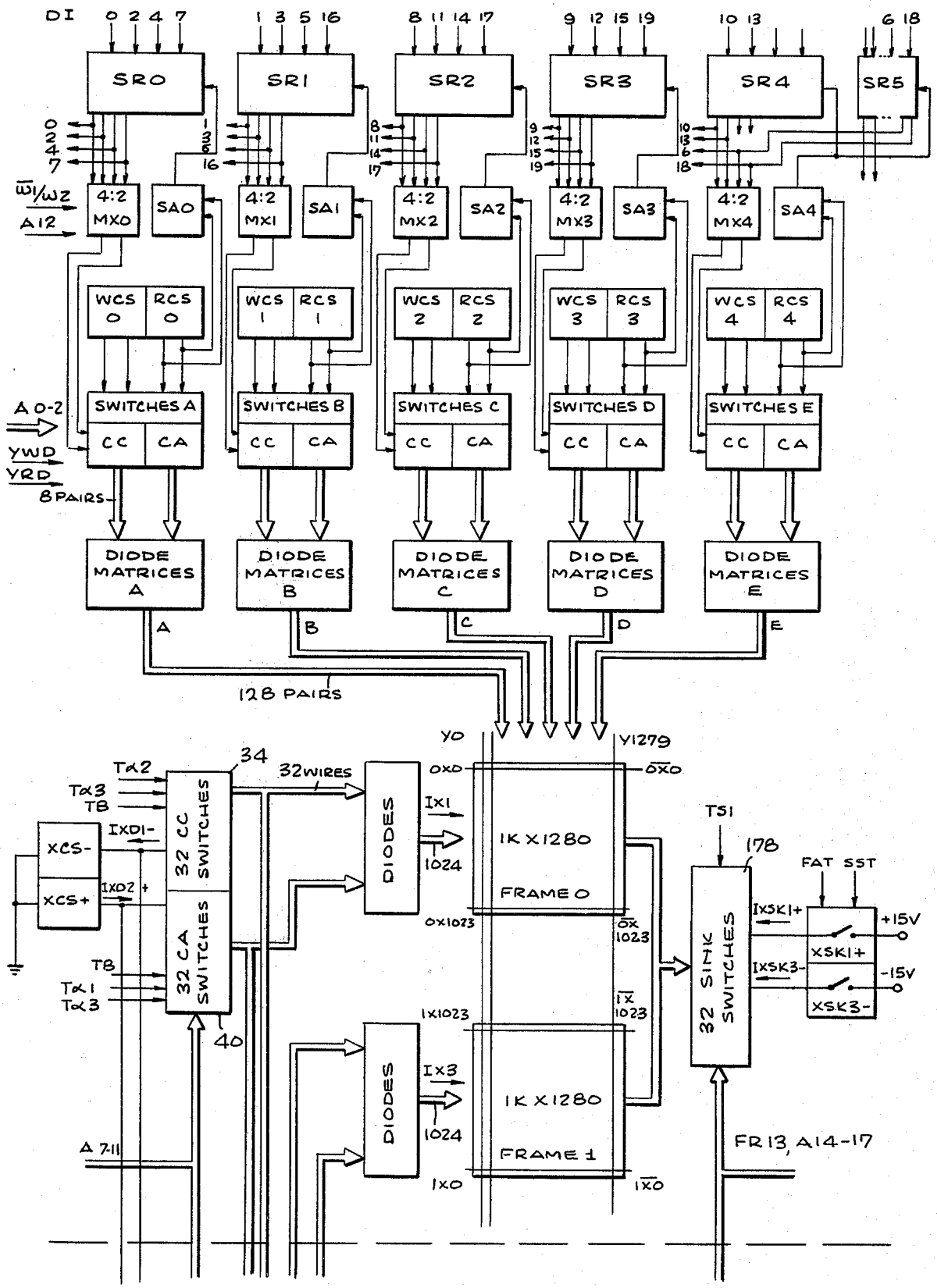
FIG. 1, consisting of [1H] *1A* through 1C, is a block diagram representation of a core memory system in accordance with the invention.
Figure 1B:
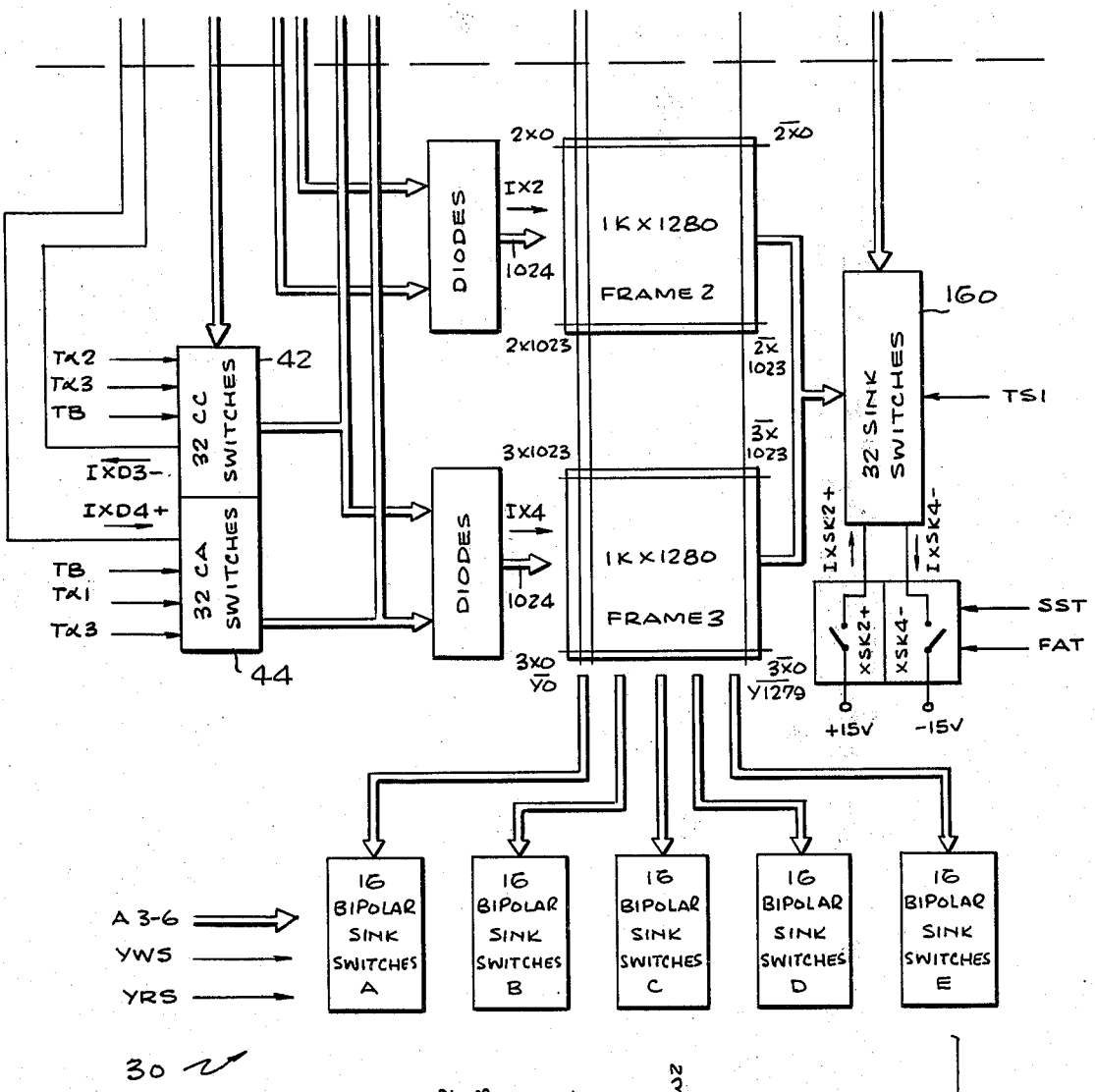
Figure 1C:
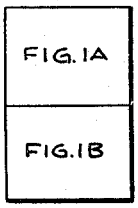

Referring to FIG. 1, a core memory 30 includes four frames designated herein frame 0 through frame 3. Each frame includes an array or matrix of magnetic memory cores which are switchable between two stable states of magnetization. Each frame contains 1,310,720 cores arranged in 1280 vertical columns and 1024 horizontal rows. Thus the 4096 X conductors each inductively couple all of the cores in a different row containing 1280 cores. In the Y direction, each of 1280 Y conductors inductively couples a column of cores from each frame or a total of 4096 cores. The Y conductors are grouped into pairs with the cores along each pair of Y conductors being oppositely oriented at each intersection of a pair of Y conductors with an X conductor. When similar polarity currents are passed through the pair of Y conductors, a selected polarity X current is coincident with one of the Y currents but is anticoincident with the other. A core memory matrix that is commonly known as two wire, 2½D is thus formed for each of the 5 bit positions spread on the four frames.

It will be appreciated by those skilled in the art that FIG. 1 shows a somewhat simplified representation of the core memory 30 with the four frames stacked end-to-end in a vertical column, with X drive circuitry on the left, with X sink circuitry on the right, with Y data and drive circuitry on top and with Y sink circuitry on the bottom. However, as the core memory 30 is actually built, conventional techniques may be employed to fold the four frames, to alternate end terminations so that for half the X conductors the drive end may be on the right and the sink end on the left while for half the Y conductors the drive end may be on the bottom and the sink end on the top. Furthermore, it is not necessary that the two conductors of a Y conductor pair be in immediate proximity. In addition, inverting data input and data output buffers may be employed so that data received from the processing system is inverted before storage by memory 30 and then reinverted as it is output back to the data processing system. Other conventional techniques may of course be employed in fabricating the memory 30.

Externally, the memory 30 appears to contain 262,144 (256 K) words with 20 bits in each word. The memory 30 can accommodate each word as 20 bits in parallel or as two 10 bit bytes containing bits 0–7, 16 and 18 in the first byte and bits 8–15, 17 and 19 in the second byte. Data in information, DI, and data out information, DO, is communicated in parallel via data conductors to and from 6 four bit shift registers designated SR0–SR5. Shift registers SR0, SR1 and SR5 are associated with byte 1 while shift registers SR2, SR3 and SR4 store data for byte 2.

The Y conductors are divided into five data groups designated A–E with 128 pairs of conductors in each group. Except for differences necessitated by different data states, the five data groups operate in parallel and simultaneously.

Five 4:2 multiplexers designated MX0–MX4 receive four bit parallel outputs from the shift registers SR0–SR5 and output a different selected two bits for each write subcycle to a corresponding write current source WCS0–WCS4 for the respective data group. During reading and writing, shift registers SR4 and SR5 operate in parallel as if each were the shift register for data group E. These shift registers are implemented as two separate shift registers only for convenience in inputting or outputting data as two separate bytes. The two left-most bits of register SR4 contain data for byte 2 while the two right-most bits of shift register SR5 contain data for byte 1. Bits 10 and 13 of byte 2 can thus be parallel loaded into register SR4 [withoutdisturbing] *without disturbing* bits 6 and 18 of byte 1 previously loaded into register SR5.

Writing into the [meory] *memory* is accomplished in two write subcycles. A signal $\overline{W1}$/W2 provided by sequence and control circuits 32 causes multiplexers MX0–MX4 to select a left-most pair of output bits from a corresponding shift register during subcycle 1 and a right-most pair of bits during subcycle 2.

The multiplexers [MXo–MX4] *MX0–MX4* must also selectively transpose the pairs of data bits between the left and right hand conductor pairs of each bit position during a write subcycle. Address bit A12 determines whether a given data bit is written into the right-hand core or the lefthand core of a pair of oppositely oriented core pairs. If address bit A12 is zero, during write subcycle 1 data bit 0 is written into the lefthand core of frame 0 while data bit 2 is written into the right-hand core of frame 2. If address bit A12 is a 1, data is written into the righthand core of frame 0 and the left-hand core of frame 2. Thus, in order for bit 0 to be written into the frame 0 position, multiplexer [MXO] *MX0* must transpose data bits 0 and 2 so that data bit 0 controls current in the righthand Y conductor of the Y conductor pair. Data bit 2 is then coupled to control the current in the left hand conductor.

Alternative methods might also be utilized to permit the data information to be properly assembled after it is read. For example, the order of reading frames 0,2 and 1,3 might be selectively transposed. It should also be kept in mind that if the physical location of the drive and sink ends are alternated as is commonly done, the required transposition of data bit positions may be further affected by X and Y address locations within each frame.

During write subcycle 1 signal $\overline{W1}$/W2 goes low to select a left-most pair of data signals from shift registers SR0–SR5 for data groups A–E respectively. These data signals are selectively transposed as explained above and used to control the presence or absence of partial select Y currents as the 10Y currents control the writing of 10 data bits into frames 0 and 2. Similarly, during write subcycle 2 signal $\overline{W1}$/W2 goes high and the two righthand bits of each set of shift registers is used to control the Y currents while 10 data bits are written into frames 1 and 3.

A pair of write current sources WCS0–WCS4 and a pair of read current sources RCS0–RCS4 for each bit position are high impedance circuits that limit the magnitude of the Y currents to approximately half that required for the full drive switching of a core. Actual energization for the currents is provided by connection to voltage sources of +15V for write currents and −15V for read currents at the sink ends.

During a write portion of a cycle pairs of series Y switches within the common cathode (CC) portion of switches A–E respond to the pair of data signals from multiplexers MX0–MX4 respectively to enable or disable the 10 Y currents in response to the data information. If a 1 is to be written a series switch is closed and a partial select Y current is allowed to flow in an associated Y conductor of a selected Y conductor pair and if a 0 is to be written, the corresponding Y series switch opens to prevent current flow.

The common cathode (CC) drive switches operate during a write portion of a memory cycle and the common anode (CA) drive switches operate in a similar manner during a read portion of a memory cycle to help select the pairs of Y conductors that may carry Y partial select currents. Each Y drive switch matrix includes eight pairs of common cathode switches, with each switch being connected to the common cathodes of 10 decoder diodes within the diode matrices A–E. There are also eight pairs of common anode switches with each switch being connected to the common anodes of 16 decoder diodes. During a write portion of a cycle, in each bit position one pair of drive switches of the eight pairs of common cathode switches is closed in response to address signals A0–A2 and Y write drive timing signal YWD. Similarly one pair of common anode drive switches is closed during a read portion of a memory cycle in response to the address bits A0–A2 and a Y read drive timing enable signal YRD.

At the sink end of the Y conductors the two conductors of each conductor pair are connected together with each of the 16 pairs that are associated with a pair of common anode switches and a pair of common cathode switches being connected to a different 1 of 16 bipolar sink switches for a corresponding data group. Selection of one pair of drive switches and one sink switch thus selects one pair of Y conductors within each data group for the conduction of current. The 16 bipolar switches for each data group operate completely in parallel and could be combined into a single set of 16 bipolar sink switches if desired. However, in the present example the current carrying requirements and physical displacements of the conductors are such that it was more convenient and economical to provide a separate set of sink switches for each data group. Because the sink switches operate in parallel, a single read cycle decoder may be employed to respond to the four address bits 3–6 to select one of 16 outputs when enabled by a low active state of a Y read sink timing enable signal YRS. Similarly, a single write decoder may be employed to respond to address bits 3–6 to select 1 of 16 outputs when enabled by an active low state of a Y write sink timing enable signal YWS. Each output of the write sink decoder is coupled to close one transistor switch to connect eight pairs of Y conductors to +15 volts in each of the five data groups. Similarly, each output of the read sink decoder is connected to close a transistor switch for each data group to connect eight pairs of Y conductors therein to −15 volts.

A read portion of a memory cycle consists of four time sequential memory read subcycles during which the five read current sources RCS0–RCS4 each generate a pair of identical partial select Y read currents continuously throughout the entire read portion of the cycle. The common anode portions (CA) of five drive switch matrices A–E provide a connection for the pairs of read currents between the proper common anodes of addressed diode matrices A–E and the read current source pairs. The five pairs of partial select Y read currents thus pass from the current sources at the driver end of the memory at the top of FIG. 1 to the common anode (CA) switches which enable one of eight sets of Y conductor pairs, each containing 32 pairs of Y conductors for each bit position. The one of eight sets is selected in response to address bit A0–A2. For each bit position only one of the 16 pairs of Y conductors selected by the Y CA drive switches to −15V. Current is thus established in only one pair of Y conductors for each bit position as determined by address signals A0–A6.

Five sense amplifiers designated SA0–SA4 sense core switching output voltages differentially across the pair of selected Y lines through which partial select currents are generated by the read current sources RCS0–RCS4, respectively. Because only one sense amplifier is provided for each bit position only 5 bits can be sensed at one time and a read portion of a memory cycle requires four time sequential memory read subcycles with five bits being read during each read subcycle.

Upon initiation of the five pairs of Y partial select read currents, substantial differential mode noise appears on the five pairs of current conductors and a delay of about 1600 nanoseconds is imposed while this differential mode noise attenuates to a level much less than the 20–25 millivolt logic 1 core switching signal peak magnitude. A partial select X current of a read polarity is then passed through an address selected X conductor of frame 0. This current is coincident with one Y partial select current from each pair of Y currents, and for each of the five data groups a core switches if a 1 has been previously written therein. The switching of a core generates a core output switching voltage signal across the pair of selected Y conductors for each bit position. This signal is detected by the sense amplifiers SA0–SA4 which generate either a logic 1 or logic 0 for data bits 0, 1, 8, 9 and 10 that is entered into the shift input of shift registers SR0–SR5, respectively. Subsequently, during read subcycle 2 the X current for frame 0 remains active while an opposite polarity partial select X current is passed through one conductor of frame 2 at a corresponding address location. This current is coincident with a Y read current of each of the five read current pairs in the conductors opposite the conductors carrying the currents that were coincident with the X current in frame 0. Five more memory cores within frame 2 thus receive a full read energization and the information states for data bits 2, 3, 11, 12 and 13 are detected by the read amplifiers and entered through the shift input of the shift registers as the five bits previously detected during read cycle 1 are shifted left one position. At the end of subcycle 2, the X currents in frames 1 and 2 are terminated and then read subcycle 3 begins with an X current being generated in frame 1. The five data bits 4, 5, 14, 15 and 6 of frame 1 are detected and shifted into the shift registers and at the end of read subcycle 3, read subcycle 4 begins with a partial select read current in frame 3 being energized. During read subcycle 4, bits 7, 16, 17, 19 and 18 are detected from the five data groups and shifted into the shift registers SR0–SR5. At the end of the fourth read subcycle, 20 bits have been shifted into shift registers SR0–SR5 and are available for outputting to an associated data processing system. Read subcycle 4 completes a read portion of a memory cycle and the X currents are terminated in frames 1 and 3 and the Y read currents are terminated.

Figure 2:
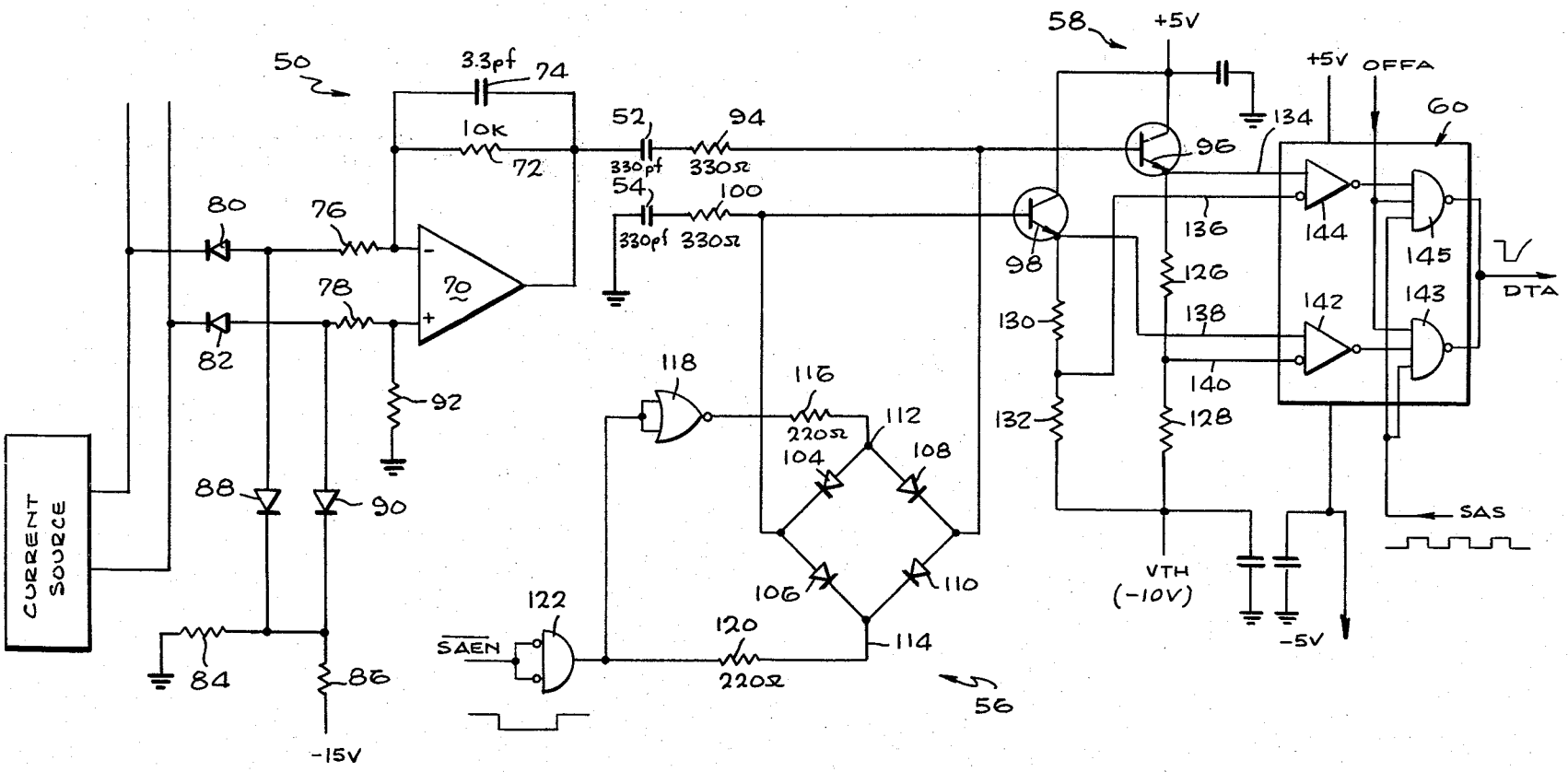
FIG. 2 is a schematic representation of an improved sense amplifier used in the memory system shown in FIG. 1.

As shown in FIG. 2, the sense amplifiers SA0–SA4, as represented by amplifier SA0, are specially built to permit the sensing of a small differential voltage pulse across a pair of current source terminals of memory 30. Typically, a sense amplifier is required to sense differentially across a pair of conductors which carry no current during a read operation and which are coupled through matched impedances to ground adjacent the sense amplifier inputs. However, in the configuration of core memory 30, the Y conductors are energized by coupling to −15 volts at their sink ends with the read current sources RCS0–RCS4 providing a high impedance to ground. Because the impedances through the decoding switches and memory core frames cannot be exactly matched for each Y current pair, and because long term changes in impedances of current paths would soon cause mismatches even if there were initial matching, steady state voltage differences of up to + or −4 volts may occur across the sense amplifier inputs prior to the receipt of a core signal. The sense amplifier SA0 is able to compensate for these DC pedestal voltage variations, which may be large with respect to the magnitude of the 20–25 millivolt core switching signal.

Sense amplifier SA0 includes a preamp input stage 50, steady state differential mode voltage compensation capacitors 52, 54, a diode bridge 56, an intermediate amplifier stage 58 and a dual polarity comparator 60.

Preamplifier 50 includes a A 715 operational amplifier 70 having a feedback circuit including a 10K resistor 72 and a 3.3 picofarad capacitor 74 coupled between the output and negative input of operational amplifier 70. An input circuit that protects the input of operational amplifier 70 from large transitions in input voltage applied thereto at a 1K resistor 76 providing the negative input and a 1K resistor 78 providing the positive input includes a diode 80 coupled to carry current from a terminal of resistor 76 opposite the negative input to a first current source output conductors of read current source RCS0, and a diode 82 connected to conduct current from a terminal of resistor 78 opposite the positive input and a second output current conductor of the pair of current conductors from current source RCS0. The input circuit also includes a pair of voltage divider resistors 84, 86 coupled in series between ground and −15 volts to provide a reference voltage of −6.8 at the junction therebetween. A diode 88 is coupled to conduct current from the junction of resistor 76 and the anode of diode 80 to the junction of resistors 84 and 86. Similarly, a diode 90 is coupled to conduct current from the junction of resistor 78 and the anode of diode 82 to the junction of resistors 84 and 86. A 10K resistor 92 is connected between the + input to operational amplifier 70 and ground.

When a read portion of a cycle is not being executed, the voltage on the pair of current source conductors for current source RCS0 goes positive to reverse bias diodes 80 and 82 and to permit both the plus and minus input to operational amplifier 70 to be clamped at approximately −6.2 volts by conduction through diodes 88 and 90. This is slightly more positive than the steady state negative voltage that exists on the pair of current conductors during a read portion of a memory cycle of memory 30. It is thus assured that during a read portion of a memory cycle diodes 88 and 90 are reverse biased while forward conduction occurs through diodes 80 and 82 to insure a low impedance coupling of resistor 76 and to the [fist] *first* current conductor and a low impedance coupling of resistor 78 to the second current conductor. Any differential switching pulse voltages which appear across the pair of current conductors is thus communicated directly to operational amplifier 70 to be amplified by a factor of −10.

The 330 μf capacitor 52 is coupled in series with a 330 ohm resistor 94 between the output of operational amplifier 70 and the base of a transistor 96 which is one of a pair of matched NPN transistors 96, 98. The 330 microfarad capacitor 54 is coupled in series with 330 ohm resistor 100 between ground and the base of transistor 98. Bridge circuit 56 includes a first pair of diodes 104, 106 coupled to conduct current from a positive input terminal 112 to a negative input terminal 114. Similarly, a pair of diodes 108, 110 is coupled in series to conduct current from positive terminal 112 to negative terminal 114. The junction of diodes 104 and 106 is coupled to the base of transistor 98 while the junction of diodes 108 and 110 is coupled to the base of transistor 96. The positive terminal 112 is coupled through a 220 ohm resistor 116 to the output of a TTL NOR gate 118. While the negative terminal 114 is coupled through a 220 ohm resistor 120 to the output of a TTL NOR gate 122. NOR gate 122 is coupled to operate as an inverter for input signal $\overline{\text{SAEN}}$ and the output thereof is also coupled to drive all inputs to NOR gate 118, which also operates as an inverter gate.

The collectors of transistors 96 and 98 are coupled together to +5 volts. The base of transistor 96 is coupled through series connected 100 ohm resistor 126 and 10K resistor 128 to a threshold voltage of VTH = −10 V. Similarly, the base of transistor 98 is coupled through series coupled 100 ohm resistor 130 and 10K resistor 132 to voltage VTH. A first non-inverting input of comparator 60 is coupled to the base of transistor 96 while a first inverting input 136 of comparator 60 is coupled to the junction of resistors 130 and 132. Similarly, a second noninverting input 138 of comparator 60 is coupled to the base of transistor 98 while a second inverting input 140 is coupled to the junction of resistors 126 and 128.

In operation, signal $\overline{\text{SAEN}}$ is high at the beginning of a read cycle to cause bridge circuit 56 to operate to charge capacitors 52 and 54 so as to maintain matched voltages at the base inputs to transistors 96 and 98 *by charging each toward the other*. The 330 ohm resistor 94 is selected to provide an adequate load impedance for operational amplifier 70 to prevent oscillations. During a read cycle the steady state output voltage for operational amplifier 70 may be anywhere within a typical range of volts and as a consequence considerable charging of capacitors 52 and 54 may be required to equalize the voltages at the base inputs to transistors 96 and 98. The capacitors 52 and 54 must be small enough to permit rapid equalization of the output voltages, but at the same time large enough to pass four successive amplified switching pulses without appreciable charging. The value of 330 picofarads has been selected as a reasonable compromise. Within 1600 nanoseconds into the read portion of a memory cycle, the inputs and outputs of operational amplifier 70 will have stabilized at steady state levels and capacitors 52 and 54 will have been charged to equalize the voltages at the base inputs to transistors 96 and 98. At this time signal $\overline{\text{SAEN}}$ goes low to reverse bias the diode bridge 56 and effectively remove it from the circuit during the sensing of the output switching pulses.

Voltage VTH, in cooperation with the voltage divider network including resistors 126, 128, 130, and 132, provides a bias for the two pairs of differential inputs to comparator 60 to control the threshold sensing level. In the present example, VTH is −10 volts to provide a 0.1 V steady state bias across each of the pairs of the input terminals. Thus, if a differential negative switching pulse is provided across the two current conductors of approximately 25 millivolts, this is amplified by operational amplifier circuit 70 to provide an output pulse of 0.25 volts to the base of transistor 96. Transistor 96 is coupled to an emitter follower configuration to provide a differential voltage relative to the emitter of transistor 98 of approximately 0.25 volts. Input lead 140 thus receives a voltage of 0.25 V less the 0.1 V drop across resistor 126 or +0.15 V relative to a noninverting input lead 138 of comparator 60. A comparator stage 142 within comparator 60 responds to this differential by enabling a NAND gate 143 to generate a data signal output while further enabled by a sense amplifier strobe signal SAS and a normally present enable signal OFFA for sense amplifier SAO. If the core switching pulse had been of the opposite polarity, the emitter of transistor 96 would have become 0.25 volts negative relative to the emitter of transistor 98 and input lead 134 would have become 0.15 volt negative relative to input lead 136. Comparator stage 144 would have responded to this voltage differential by providing a positive output to enable NAND gate 145 and cause the output of comparator 60 to *go* active low to indicate the detection of data. Four output switching pulses of alternating polarities may thus be sensed in rapid succession between time 1600 nsec and time 2600 nsec when signal $\overline{SAEN}$ again goes high to cause circuit 56 to conduct.

Figure 3:
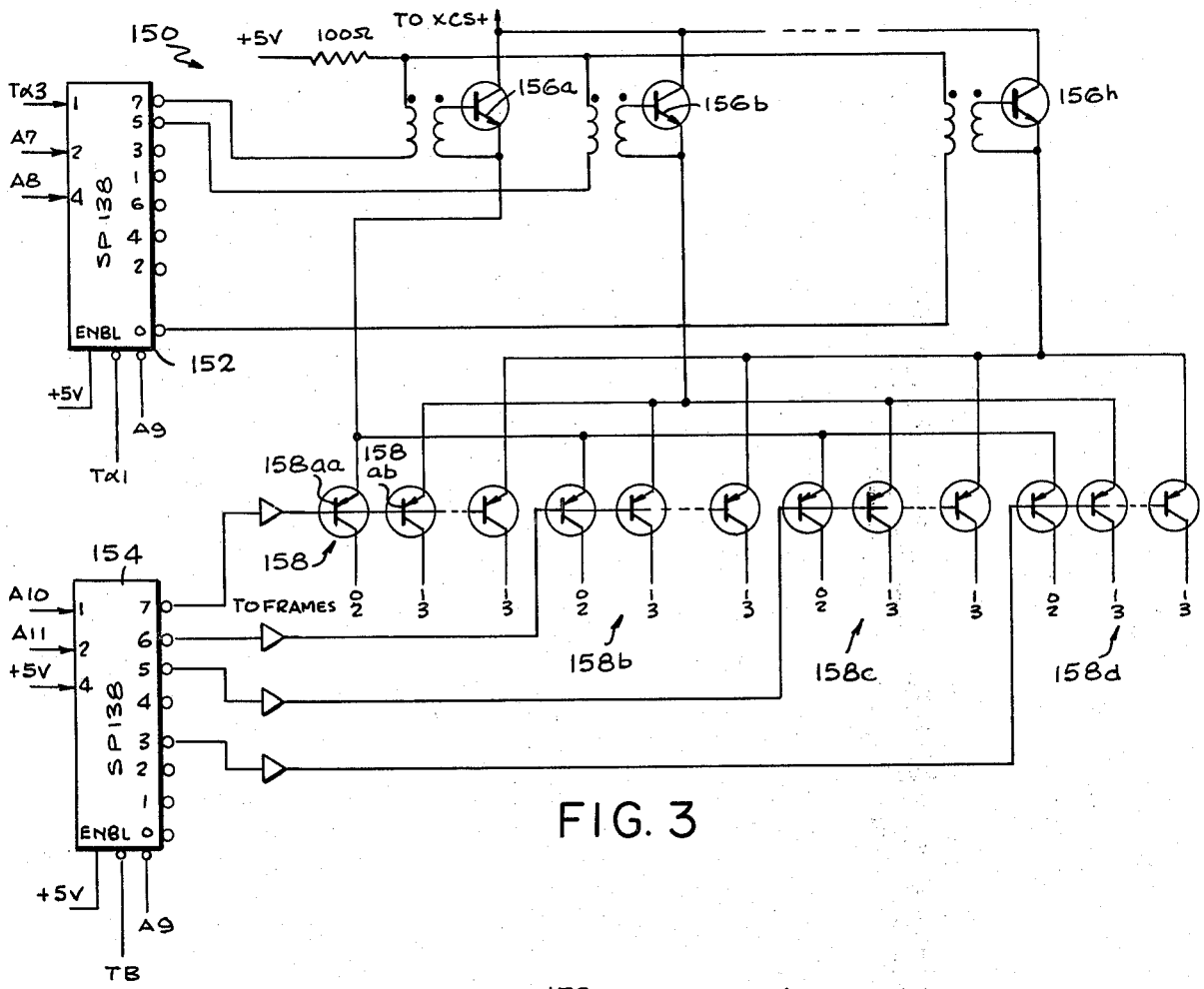
FIG. 3 is a schematic representation of a first portion of a common anode X drive switch circuit for the memory system shown in FIG. 1.

Referring now to FIGS. 1 and 3[.], the X drive switches 34, 40, 42 and 45 are functionally organized as shown in FIG. 1. However, the physical construction is simplified and the manufacturing costs are reduced by actually implementing the 32 common anode switches 40 and the 32 common anode switches 44 as a single set of 64 common anode switches. The common anode drive switches, which themselves form part of an X conductor drive selection matrix in conjunction with the X sink switches, are in turn selected by a decoder matrix. While the 64 common anode drive switches could be selected by an 8×8 decoder matrix, for convenience of manufacture it has been found desirable to employ two independent 8×4 decoder matrices. Similarly, the common cathode switches 34 and 42 are implemented as a common 8×8 matrix that is physically split into two 8×4 matrices of X drive switches.

As shown in FIG. 3, a drive switch decoder matrix 150 which is the first of two common anode drive switch decoder matrices, includes an SP138 3 bit binary decoder 152, an SP138 3 bit binary decoder 154, eight pre-drive decoder switches 156a–156h, and four drive switch sets 158a–158d, each including eight PNP transistor drive switches. The outputs of decoders 152 and 154 are numbered to indicate the terminal that is selected by the three binary coded inputs that are weighted as indicated.

One of the drive switches 158 is closed only when address selection signal A9 is at logic 0 and timing and address signal T$\alpha$1 is at logic 0 to enable decoder 152 while base timing signal TB is also at logic 0 to enable decoder 154. When both decoders are enabled, address signals A7 and A8 combine with timing and address signal T$\alpha$3 to cause one of the eight outputs of decoder 152 to go active low and thereby select one of the pre-drive switches 156a–156h. The selection of a pre-drive switch in turn enables one drive switch from each of the four sets 158a–158d while address selection signals A10 and A11 cause decoder 154 to select one drive switch from the four that have been enabled to thereby select exactly one of 32 drive switches. A second 32 switch common anode drive switch decoder matrix is not shown but is identical to the matrix 150 except that the decoders are connected to be enabled by a logic 1 on address signal A9. Address signal A9 thus determines whether the first or second matrix is selected to permit selection of one of 64 common anode X drive switches. The physical arrangement is thus compatible with the functional arrangement shown in FIG. 1 in which one of 64 common anode drive switches is selected at any given time.

Each of the collectors of the common anode X drive switches 158 connects to the common anodes of 32 decoder diodes for 32 separate X drive conductors in each of two core memory frames. Half of the X drive switches 158 connect to 32 X conductors in frame 0 and 32 X conductors in frame 2 while the other half of the switches 158 connect to 32 X conductors in frame 1 and 32 X conductors in frame 3. For example, decoder switch 158aa couples to 32 diode anodes in frame 1 and to 32 diode anodes in frame 3. Similarly, common anode drive switches such as switch 158ah or switch 158bh connect to the anodes of 32 X decoder diodes for frame 0 and to the anodes of 32 X decoder diodes for frame 2. The signal T$\alpha$3 thus determines whether the common anode X drive switches will enable the passage of current through X conductors of [frame] *frames* 0 and 2 or frames 1 and 3. If signal T$\alpha$3 is at logic 1, X drive current for frames 1 and 3 will be enabled. Similarly, if signal T$\alpha$3 is at logic 0, X drive current for frame 0 and frame 2 will be enabled. Thus, relating FIG. 3 back to FIG. 1, signal T$\alpha$3 determines whether common anode switch group 40 or common anode switch group 44 is selected while signals A7–A9, T$\alpha$1, and TB determine the timing and selection of particular switches within each group.

The 64 common cathode X drive switches 34 and 42 are organized in a manner similar to the common anode X drive switches 40 and 44 except that NPN transistor drive switches are employed and current flows in the opposite direction. The decoders are coupled in a similar manner with address signal A9 determining which set of 32 switches is activated. However, to provide the proper timing and frame selection for the opposite polarity X drive currents, signal T$\alpha$2 is substituted for signal T$\alpha$1 as an enabling input for the decoders corresponding to decoder 152.

Figure 4:
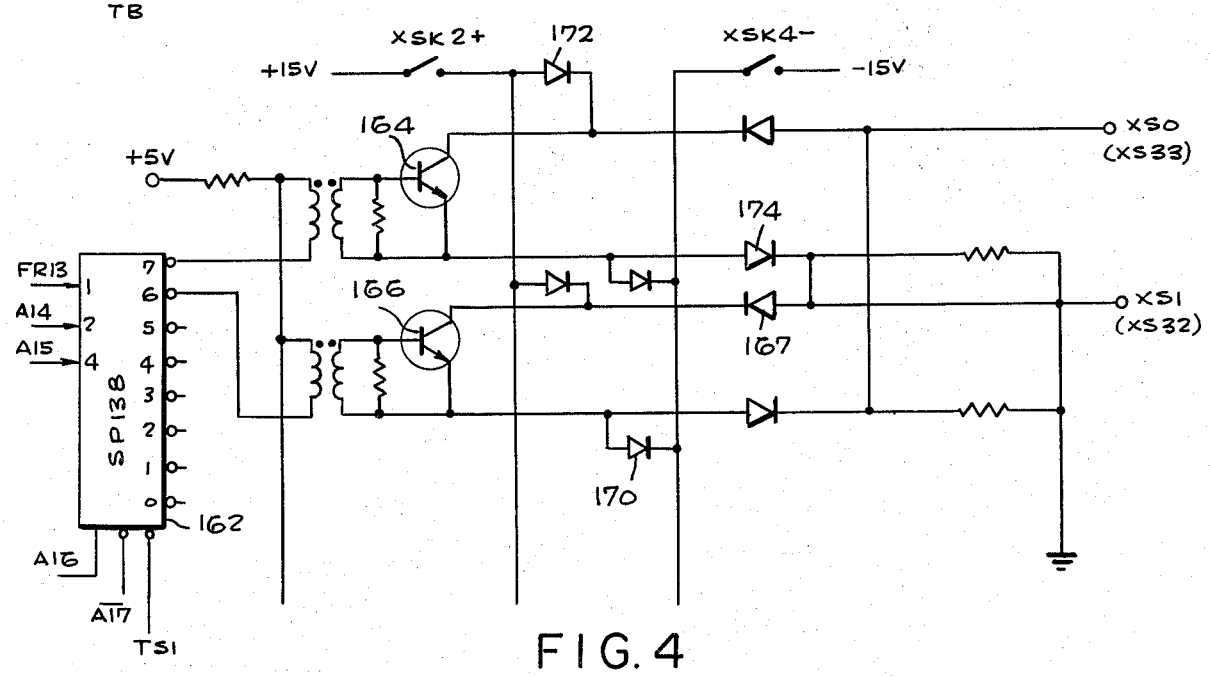
FIG. 4 is a schematic representation of a portion of an X sink switch circuit for the memory system shown in FIG. 1.

The X sink switches are arranged for decoding in a somewhat more straightforward manner. A portion of X sink switches 160 is illustrated in FIG. 4. The X sink switches 160 [includes] *include* four 3 bit binary decoders identical to decoder 162 except that the enable address inputs A16 and A17 are arranged in mutually exclusive combination such that exactly one of the decoders is selected at any one time. Sink timing signal TS1 is connected to partially enable each of the four encoders when at logic 0. Each of the encoders 162 is responsive to binary coded input signals provided by address input signals A14 and A15 and phase referenced address signal FR13. Signal FR13 has the logical function

FR13=A13 EXCLUSIVE OR A12 EXCLUSIVE OR [$\overline{R/W}$] $\overline{R/W}$.

Since the portion of the logic function A12 EXCLUSIVE OR [$\overline{R/W}$] $\overline{R/W}$ determines desired current direction, and since FR13 is connected to the least significant input to decoder 162, an odd or an even output of decoder 162 is selected in accordance with the status of address signal A13 and a desired current direction.

A pair of X sink switches 164, 166 are connected to be energized upon active low status for outputs 0 and 1 of decoder 162 respectively. The sink switches 164, 166 are connected to output sink conductors XS0 and XS1 such that the two sink switches 164 and 166 can provide bidirectional sink switching for each of the pair of outputs for two directions of current flow and thus serve the function of four switches. The collector of each of the X sink switches is diode coupled to positive series sink switch +SK2 while the emitters of each of the X sink switches are diode coupled to negative sink switch −SK4.

Each of the output conductors XS0–XS3 is coupled to 32 X drive conductors in frame 2 and 32 X drive conductors in frame 3. If address and timing conditions arise such that it is desired to provide a positive current (from drive end toward sink end) through sink switch XS1, series sink switch −SK4 is closed and address signals A16, A17, A14 and A15 go high while signal FR13 goes low to select the one output of decoder 162 to turn on transistor 166. Current thus flows through diode 168 transistor 166 and diode 170 to series sink switch −SK4. Alternatively, if it were desired to reverse the current direction on sink switch common line XS1, signal FR13 would be low instead of high and series sink switch +SK2 would be turned on instead of series sink switch −SK4. Current would then flow through diode 172, transistor 164 and diode 174 to X sink conductor XS1. It is thus apparent that selection of transistor 164 enables a positive current on X sink conductor XS0 and a negative current on X sink conductor XS1 while closure of transistor switch 166 enables a positive current on X sink conductor XS1 or a negative current on X sink conductor XS0. Thus, selection of one of the series sink switches +SK2 or −SK4 in conjunction with selection of one of the two transistors 164, 166 determines the direction of current and which one of a pair of X sink conductors the current is generated on.

Though not specifically shown, the decoder circuit 162 has connected thereto four more pairs of transistors and sink switch arrangements identical to the sink switch arrangement for switches 164 and 166 to drive X sink conductors XS2–XS7. In addition, the X sink switches for frames 2 and 3 include three more sets of decoders identical to decoder 122 with four pairs of transistor switches connected thereto. All four decoder circuits corresponding to decoder circuit 162 for the 32 sink switches for frames 2 and 3 are connected to address signals A16 and A17 so as to permit selection of exactly one of the four decoders in response to the state of address signals A16 and A17. 32 X sink conductors are thus provided for the X sink switches 160 and each X sink conductor is connected to 32 X conductors in frame 2 and 32 X conductors in frame 3.

The 32 X sink switches 178 are identical to the 32 X sink switches 160 except that corresponding pairs of adjacent X sink conductors are connected in an interchanged manner. Thus, as indicated in parentheses in FIG. 4, X sink conductor XS33, which corresponds to X sink conductor XS1 is connected as X sink conductor XS0 would be in sink switches 160. Similarly, in X sink switches 178, X sink conductor XS32 is connected as is X sink conductor XS1 for sink switches 160. Thus, as a given X sink conductor is selected by X sink switches 160 for one direction of current, a corresponding X sink conductor within X sink switches 178 is simultaneously selected for an opposite direction of current. The selective closure of X sink series switches XSK1+, XSK2+, XSK3− and XSK4− determines the direction of current flow through the selected X sink conductors.

To further facilitate an understanding of the operation of this invention, the operation of the memory 30 will be described during a read-write cycle. For purposes of this example it will be assumed that the 18 address bits, designated 0–17 are respectfully as follows: 0000 0001 1011 0011 11. One of the key address bits in determining current direction and circuit timing is address bit A12. For purposes of this example this address bit has been selected to be 0 to select the numbered cores shown in FIG. 5.

Figure 5:
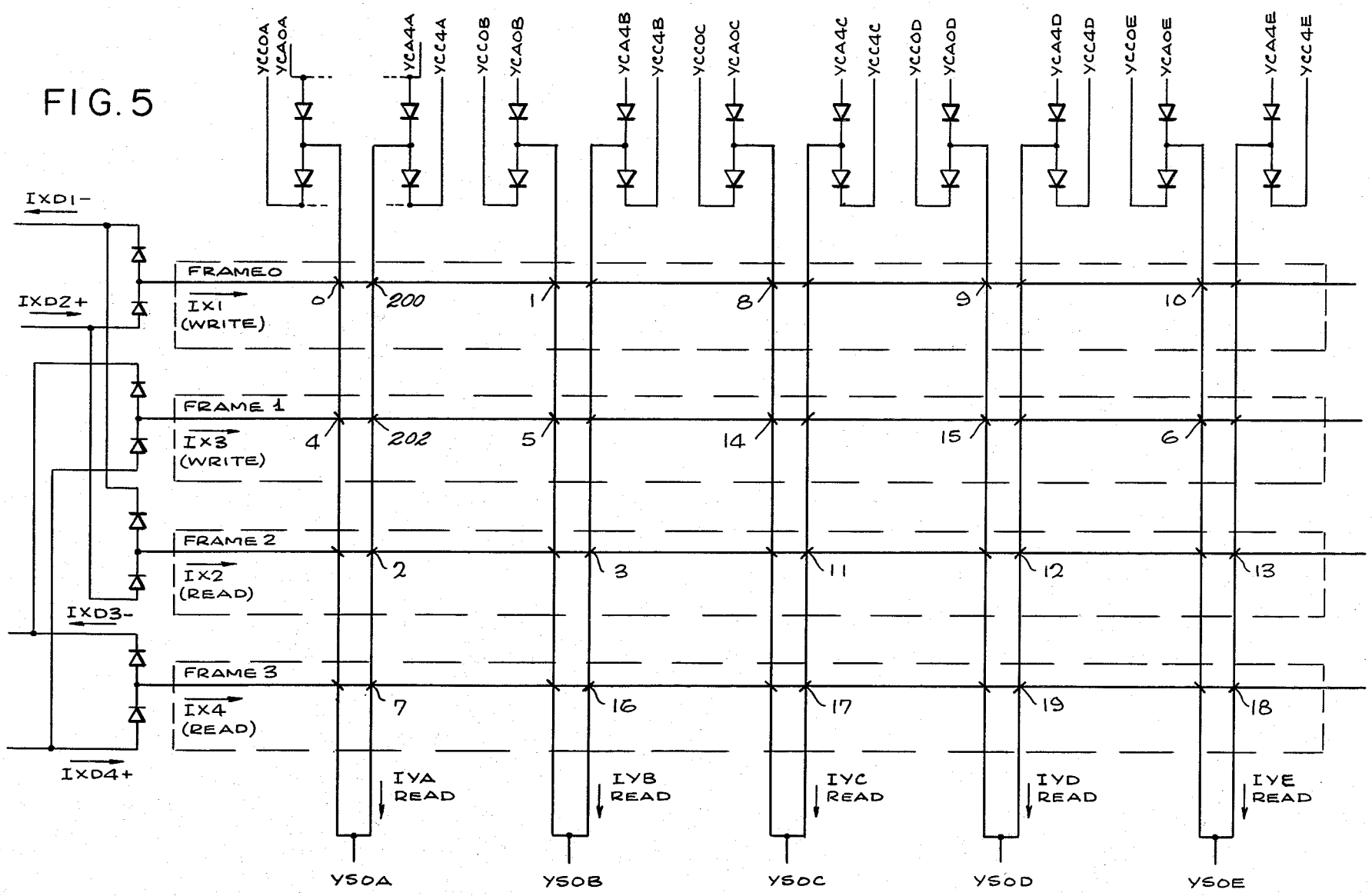
FIG. 5 is a schematic representation of a portion of the core memory system shown in FIG. 1.
Figure 6A:
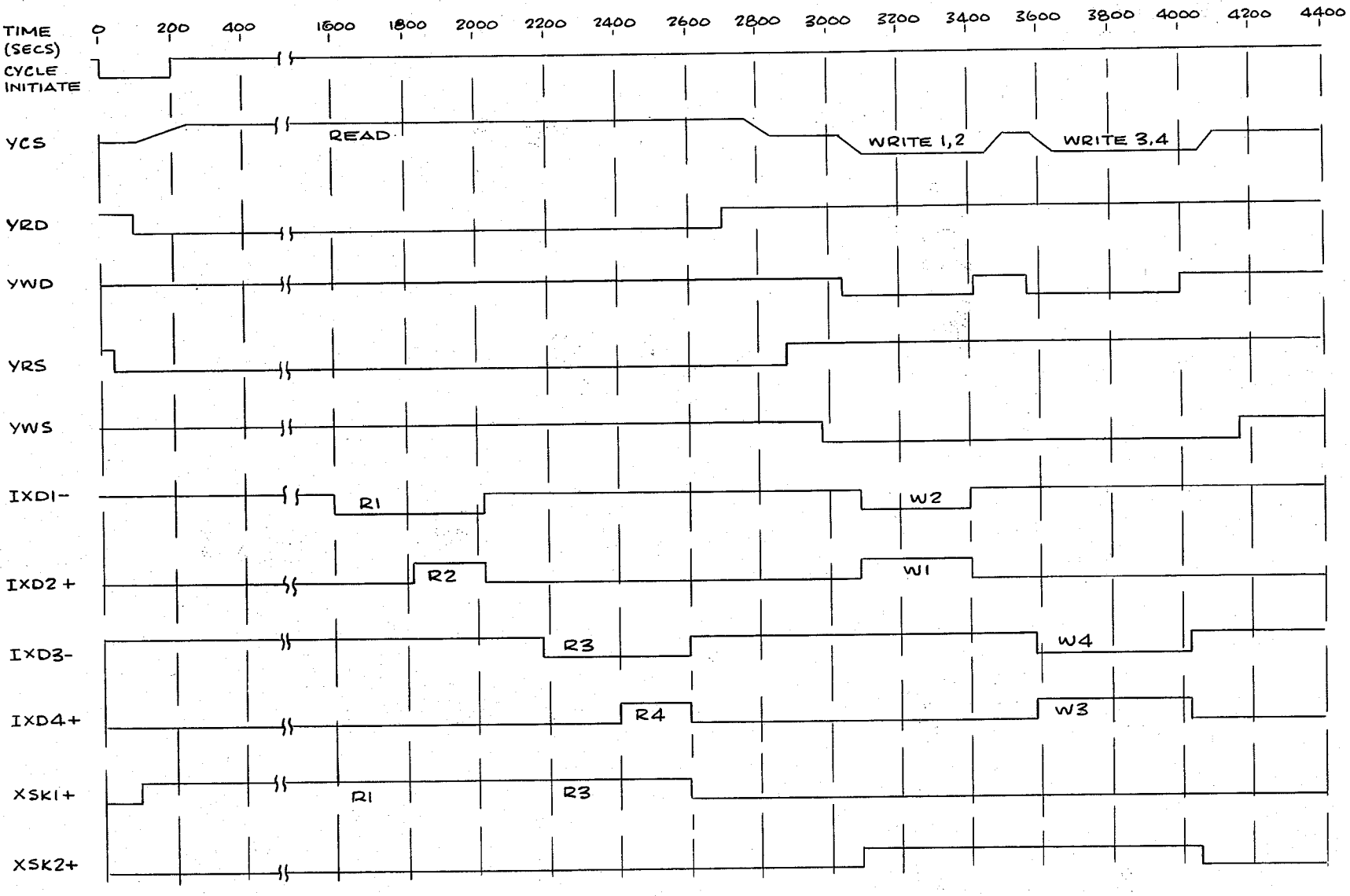
FIG. 6, consisting of 6A though 6D, is a timing diagram that is helpful in understanding the operation of the memory system shown in FIG. 1.
Figure 6B:
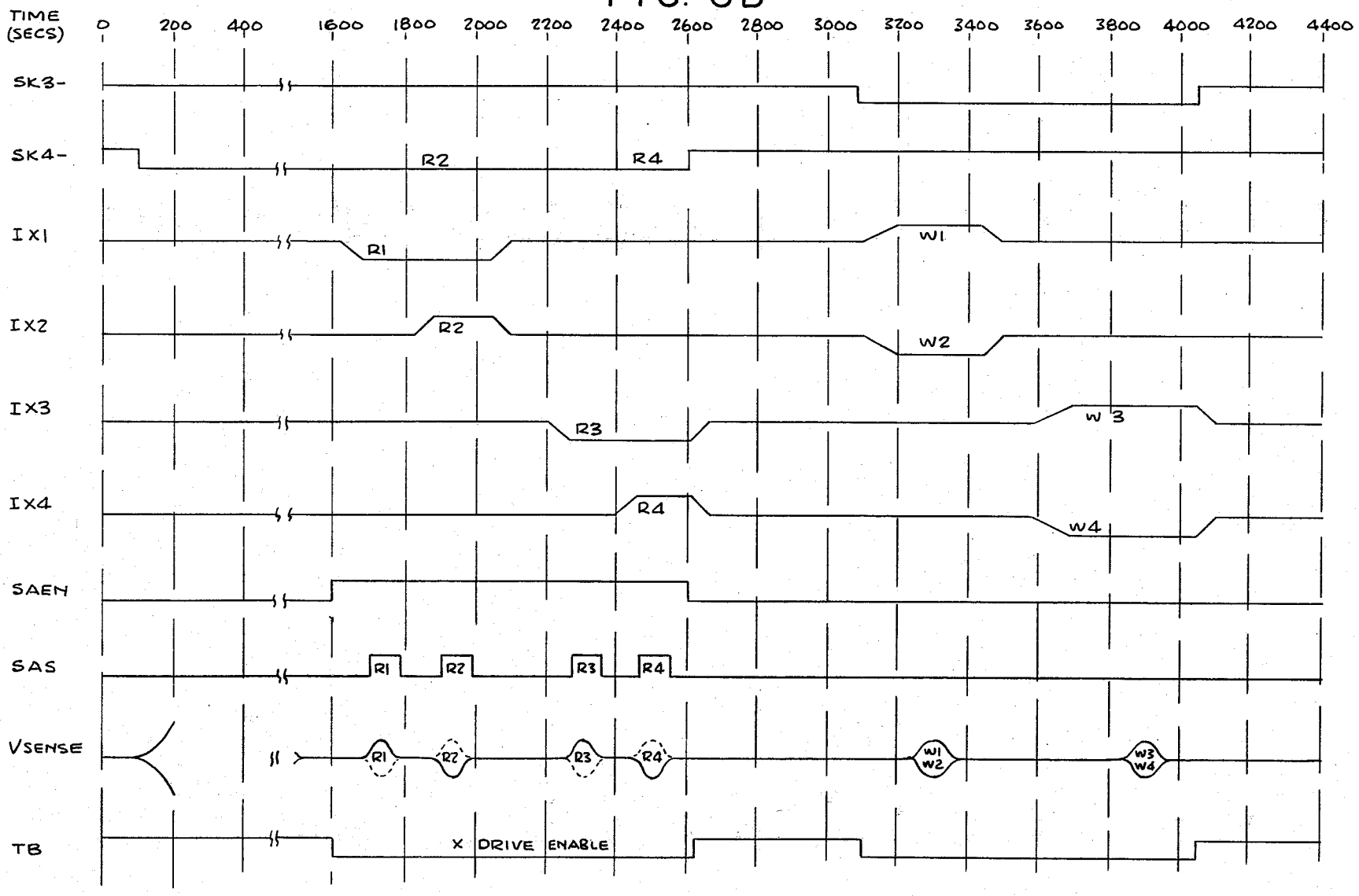
Figures 6C, 6D:
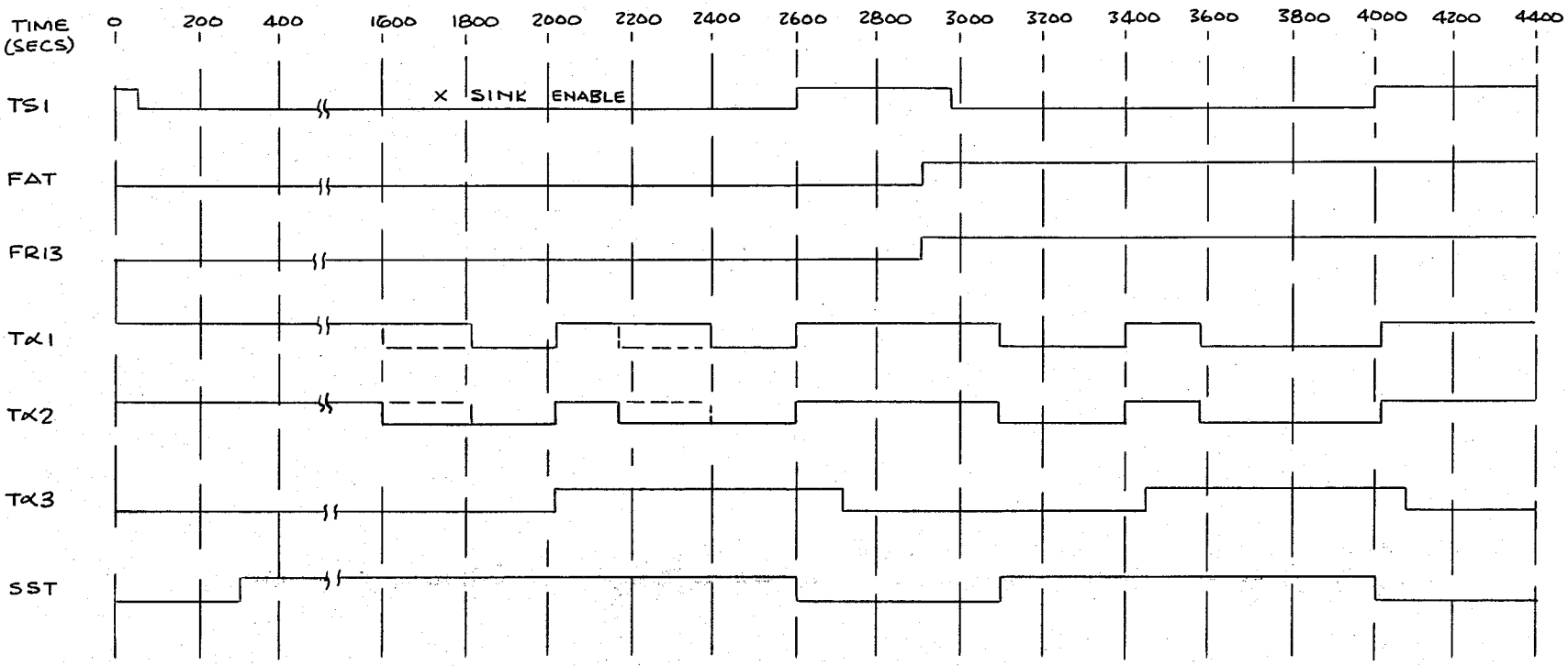

Referring now to FIGS. 5 and 6, a 200 nanosecond cycle initiate pulse starts the read-write cycle at time 0. The Y current control is relatively simple and begins with the Y read sink switches being enabled by signal YRS at time 50 nanoseconds and remaining enabled until time 2880 nanoseconds at the end of a read portion of the cycle. At time 100 nanoseconds, the Y driver circuits are enabled by signal YRD and remain enabled until time 2700 nanoseconds. As indicated by the Y current signal YCS, one pair of Y read currents thus flows from the drive end toward the sink end for each of the 5 bit positions A–E. The Y current rise and fall times are about 100 nanoseconds and are controlled by the Y read drive signal YRD at 120 msec and 2700 nsec. Similarly, opposite polarity write currents are enabled for a first write subcycle during time 3050 nanoseconds through time 3410 nanoseconds and during time 3580 nanoseconds through time 4000 nanoseconds. Signal YWD enables the Y drive common cathode switches between times 3050 nsec and 3410 nsec for the first write subcycle and between times 3580 and 4000 for the second write subcycle. Signal YWS enables the Y sink switches throughout both write subcycles between times 2980 and 4170 nsec. As explained previously, the information state of data being written determines whether Y current actually flows during a write subcycle.

To enable the proper X read currents, sink switches XSK1+ and XSK4− are turned on at time 100 nanoseconds and remain on until the completion of the fourth read subcycle at time 2600 nanoseconds. When high, phase and timing signal FAT selects X sink series switches XSK2− and XSK3+, but during a read portion of a cycle signal FAT goes low if address bit A12 is 0 to select X sink series switches XSK1+ and XSK4−. Sink timing signal TS1 actually enables the closure of all X sink series switches. The logic functions for these and other pertinent signals are shown in Table I below. To enable reading of frame 0, a negative X read current, IX1, must flow through the selected X conductor of frame 0. This is accomplished by enabling one of the sink switches 178 and one of the common cathode drive switches 34. As noted previously, the X sink switches 178 are identical to those shown in FIG. 4 except that the X sink conductors are connected as indicated in parentheses. In the present example, address signals A14–A17 are respectfully 1111 to select either terminal 0 or terminal 1 of decoder 162. Signal FR13 is equal to 0 in the present example during the read cycle and equal to 1 during the write cycle. Output 6 is thus selected to enable transistor 166 and series switch SK2+ in FIG. 4 corresponds to the closed series switch XSK1+, in FIG. 1. Current thus flows from the + voltage supply through transistor 166 to X sink conductor XS33.

TABLE I

| | |
|---|---|
| $\overline{YRD}$ | $= R/\overline{W} \cdot$ (100 nsec–2700 nsec) |
| $\overline{YWD}$ | $= \overline{R/W} \cdot$ [(3050 nsec–3410 nsec) + (3580 nsec–4000 nsec)] |
| $\overline{YRS}$ | $= R/\overline{W} \cdot$ (50 nsec–2880 nsec) |
| $\overline{YWS}$ | $= \overline{R/W} \cdot$ (2980 nsec–4170 nsec) |
| FAT | $= A12 + \overline{R/W}$ |
| SAEN | $= R/\overline{W} \cdot$ (1600 nsec–2600 nsec) |
| SAS | $= R/\overline{W} \cdot$ [(1710 nsec–1790 nsec) + (1910 nsec–1990 nsec) + (2280 nsec–2360 nsec) + (2480 nsec–2560 nsec)] |
| TB | $= R/\overline{W} \cdot$ (1600 nsec–2620 nsec) + $\overline{R/W} \cdot$ (3090 nsec–4050 nsec) |
| TX1 | $= R/\overline{W} \cdot$ (50 nsec–2600 nsec) + $\overline{R/W} \cdot$ (2980 nsec–4000 nsec) |
| FR13 | $= A12 + A13 + \overline{R/W}$ |

TABLE I-continued

| | |
|---|---|
| Tα1 | $= R/\overline{W} \cdot \overline{A12} \cdot$ [(1820 nsec–2020 nsec) + (2400 nsec–2600 nsec)] + $R/\overline{W} \cdot A12 \cdot$ [(1600 nsec–2020 nsec) + (2170 nsec–2600 nsec)] + $\overline{R/W} \cdot$ [(3100 nsec–3400 nsec) + (3590 nsec–4020 nsec)] |
| Tα2 | $= R/\overline{W} \cdot \overline{A12} \cdot$ [(1600 nsec–2020 nsec) + (1970 nsec–2600 nsec)] + $R/\overline{W} \cdot A12 \cdot$ [(1820 nsec–2020 nsec) + (2400 nsec–2600 nsec)] + $\overline{R/W} \cdot$ [(3100 nsec–3400 nsec) + (3590 nsec–4020 nsec)] |
| $\overline{T\alpha 3}$ | $= R/\overline{W} \cdot$ (0 nsec–2020 nsec) + $\overline{R/W} \cdot$ (2720 nsec–3450 nsec) |
| SST | $= R/\overline{W} \cdot$ (300 nsec–2600 nsec) + $\overline{R/W} \cdot$ (3080 nsec–4000 nsec) |

In order to complete the current path, one of the common cathode X drive switches 34 must also be selected. Signal Tα2 thus goes low to enable a partial select negative current IX1 starting at time 1600 nanoseconds and continuing through the read 1 and read 2 subcycles. Signal Tα3 is low during this time period to address decoder 152 in FIG. 3 such that a common cathode X drive switch 34 is enabled rather than one of the common cathode X drive switches 42. At time 1830 nanoseconds, the read 2 subcycle begins with signal Tα1 going low to enable the common anode X drive switches 44 and 40 while signal Tα3 is at logic 0 to address common anode drive switches 40 within the group 40 and 44. Since signals [EAT] *FAT* and SST enable the X sink switches 160 and X series switch XSK4− throughout the read 1–read 4 subcycles positive partial select current IX2 is permitted to flow through a selected conductor of frame 2 to permit the reading of a core within frame 2 for each bit position.

As best shown in FIG. 2, the negative current IX1 in frame 0 is coincident with the lefthand Y current of each Y current pair to permit the reading of bits 0, 1, 8, 9 and 10. Subsequently during read subcycle 2, the positive current IX2 in frame 2 is coincident with the right hand Y current of each Y current pair to permit the reading of bit positions 2, 3, 11, 12 and 13.

At the end of read subcycle 2, the X currents are terminated by the disabling of the X drive switches 34 and 40 as signals Tα1 and Tα2 go inactive high. At the same time, signal Tα3 goes from low to high to cause X drive switches 42 and 44 to be addressed during the read 3 and read 4 subcycles in lieu of X drive switches 34 and 40 which were addressed during the read 1 and read 2 subcycles. After a short time delay to permit the attenuation of any noise generated on the selected pairs of Y conductors resulting from termination of currents IX1 and IX2 and to assure these currents have terminated in the previously energized X conductors in frames 0 and 2, at time 2220 signal Tα2 goes active low to enable the flow of a negative partial select current IX3 through common cathode X drive switches 42. This current flows through series switch XSK1+ which remains closed during the entire read portion of a cycle and sink switches 178 to cause the reading of data in frame 2 during read subcycle 3. Current IX3 is coincident with the lefthand current of each Y current pair to permit the reading of bit positions 4, 5, 14, 15, and 6 as indicated in FIG. 5.

Current IX3 remains energized as timing signal Tα1 goes active low at time 2400 nanoseconds to initiate read subcycle 4. Signal Tα1 enables one of the common anode switches 44 to permit current IX4 to flow from current source XCS+ through common anode switches 44 and frame 3. From frame 3 current IX4 flows through one of the switches 160 which has remained closed and through X sink series switch XSK4− to the −15 volt supply. At time 2600 or shortly thereafter signals Tα1 and Tα2 go inactive high to terminate currents IX3 and IX4, signal TB goes inactive high to disable all of the X drive switches, signal SST goes inactive low to disable the series sink switches and signals YRD and YRS go inactive high to inhibit the pairs of Y read currents. Shortly thereafter at time 2770 nanoseconds signal Tα3 returns to logic 0 to address common cathode and common anode switches 34 and 40 in preparation for the [wire] *write* 1 subcycle and the write portion of the cycle begins at 2980 nanoseconds when signal YWS goes low to enable the Y sink write switches for a write polarity of current opposite the read polarity in the selected pairs of Y conductors. At time 3050 nanoseconds the Y drive switches become enabled by signal YWD and current begins to flow in the selected pairs of Y conductors only if the data associated with each Y conductor as indicated by the outputs of multiplexers MX0–MX4 is logic 1.

At time 2920 nanoseconds signal FAT goes high to cause series sink switches SK2+ and SK3− to be selected and remain selected throughout the 2 write subcycles. At time 2920 signal FR13 also goes high to properly address the sink switches 160 and 178 to account for the reversal of current direction during the write subcycles. At time 1980 signal TS1 goes active low to enable the sink switches 160, 168 and write polarity X currents IX1 and IX2 begin to flow through frames 0 and 2 at time 3090 nanoseconds as signals TB, Tα1, and Tα2 go active low and signal SST goes active high to fully enable the X drive switches 34, 40, and the series sink switches XSK2+ and XSK3−.

During the write 1 time interval current IX1 flows in a write direction from current source XCS+ through X drive switches 40, through frame 0, through sink switches 178 and through series sink switch XSK3− to the −15 volts supply. Simultaneously, current IX2 flows in a write direction from the +15 volts supply through sink series switch XSK2+, sink switches 160, [trough] *through* frame 2, and through common cathode switches 34 to current source XCS−. At time 3400 signals Tα1 and Tα2 go high to disable the drive[,] switches 34, 40 and terminate X currents IX1 and IX2 at the end of write subcycle 1. At time 3410 nanoseconds signal YWD goes high to disable the Y write drive switches and terminate the Y currents.

At time 3450 nanoseconds signal Tα3 goes high to address X drive switches 42 and 44 for write subcycle 2 and write subcycle 2 actually begins at time 3580 nanoseconds as signal YWD goes active low to enable the Y drive currents during write subcycle 2. As with write subcycle 1, current actually flows in a given one of 10 selected Y conductors only if a logic 1 is to be written into a bit position corresponding thereto. Also at time 3580, signals Tα1 and Tα2 go active low to enable X drive switches 42, 44 and permit X currents IX3 and IX4 to flow through frames 1 and 3 respectively in opposite directions. Write current IX3 flows from current source XCS+ through common anode switches 44, through frame 1, through sink switches 178 and through series sink switch XSK3− to the −15 volts supply. Simultaneously, current IX4 flows from the +15 volts supply through series sink switch XSK2+, through sink switches 160, through frame 3, and through common cathode switches 42 to current source XCS−. At 4000 nanoseconds or shortly thereafter the memory cycle is terminated with the completion of write subcycle 2. To complete the second write subcycle, signal YWD goes inactive high to disable the Y drive switches, and terminate the Y drive currents while signal YWS goes inactive high to disable the Y sink switches. Disabling of the X drive and sink switches occurs as signal TWB goes inactive high, signal TS1 goes inactive high, [signal] *signals* Tα1 and Tα2 go inactive high, and signal SST goes inactive low. At time 4080 nanoseconds signal Tα3 again goes low to address X drive switches 34 and 40 in preparation for the next memory cycle.

It will be observed that at the end of each memory cycle, whether a read only cycle or a read/write cycle, half of the unselected cores along any given Y or digit-sense conductor have received as a last X or word current a partial select read current while the other half have received a partial select write current. This is significant in minimizing delta noise recovery time for a Y conductor pair.

Delta noise generated by partial selection of a core depends substantially on the last preceding partial select current received by a core. If the new current is a read current and the last current was a write current, the delta noise will be about four times as great as if the last current were also a read current. In prior art memories worst case conditions can arise where a first conductor of a Y conductor pair has cores therealong which have all received a last current in the write direction and a second conductor which has cores therealong which have all received a last current in the read direction. Consequently, when partial select read currents are passed through the Y conductor pair the first conductor experiences relatively little delta noise while the second conductor experiences much greater delta noise. A substantial delta noise recovery time must then [press] *pass* before the delta noise imbalance can be adjusted sufficiently to permit differential sensing of core switching signals across the conductors.

In arrangements according to this invention the cores along any given sense conductor appear in core pairs such that the last current which has been received by each following a memory cycle has been in opposite read/write directions. For example, referring to FIG. 5, at the end of the previously discussed read/write memory cycle the last IX1 current received by core 200 is in the read direction as core 0 is written while the last current received by core 7 is in the write direction as core 7 is written. Similarly, a last read current through core 202 is paired by a last write current through core 2. This identical paired relationship of course exists for the cores positioned along the unselected Y conductor pairs which have not been explicitly shown in FIG. 5. As a result of this compensatory pairing of last currents, substantially equal, [intermediate level] delta noise always appears on both conductors of a Y conductor pair in response to a partial selection digit read current. This balance minimizes the worst case delta noise recovery time.

*In order to prevent the digit partial select currents from destroying the delta noise balance established by the opposite polarity word current pairs in applications where balanced delta noise cancellation is important, it is necessary to assure that write partial select current does not flow in one conductor of a digit-sense conductor pair during a write portion of a memory cycle without also flowing through the other conductor as well. If the technique previously disclosed herein of writing two bits at a time by individually controlling the write digit currents were used, a worst case data pattern could develop where the writing of a "1" along one digit-sense conductor of a pair leaves all of the cores therealong in a write disturb state while the writing of all zero's along the other digit-sense conductor during a memory cycle inhibits the flow of write current and leaves all of the cores along that conductor in a read disturb state at the end of a memory cycle. One way to avoid this imbalance condition is to simply write one bit at a time and to always drive the digit-sense conductor pairs with balanced currents during the write as well as the read portion of a memory cycle as in prior arrangements. See for example, Roy Norman "A 2D Million Bit High Speed Core Memory," Computer Design, December 1967, pp. 54–60; and U.S. Patent No. 3,484,763 (especially Col. 6, line 19 through Col. 7, line 14).*

While there has been shown and described above a particular arrangement of a core memory in accordance with the invention, for the purpose of enabling a person of ordinary skill in the art to make and use the invention, it will be appreciated that the invention is not limited thereto. Accordingly, any modifications, variations, or equivalent arrangements within the scope of the attached claims should be considered to be within the scope of the invention.

What is claimed is:

1. A core memory comprising a plurality of pairs of memory cores;

a plurality of pairs of Y conductors inductively coupling a plurality of pairs of memory cores;

a plurality of X conductors, each inductively coupling different pairs of memory cores that are inductively coupled by the Y conductors;

Y decoder circuitry coupled to select a pair of Y conductors in response to at least one address signal;

X decoder circuitry coupled to select at least two X conductors in response to at least one address signal;

Y current control circuity coupled to operate during a read portion of a memory cycle to provide partial select Y read currents through the pair of Y conductors, the Y read currents coupling each pair of cores inductively coupled to the selected pair of Y conductors with first and opposite polarities relative to a given direction of current through an X conductor inductively coupled thereto;

X current control circuitry coupled to operate during a read portion of a memory cycle to sequentially provide partial select X read currents through the selected at least two X conductors;

a sense amplifier circuit coupled to sense core switching voltage signals appearing sequentially on the selected pair of Y conductors as X read currents are provided sequentially on the selected X conductors.

2. The core memory according to claim 1 above, further comprising an interface circuit coupled to assemble multibit data information indicated by the sequential sensing of a plurality of core switching signals and provide said data information simultaneously in parallel.

3. The core memory according to claim 1 above, wherein the Y current control circuitry is further coupled to operate during a write portion of a memory cycle to provide partial select write currents of polarity opposite the read currents with each Y write current being selectively inhibited in response to data information to be written thereby; and wherein the X control circuitry is further coupled to operate during a write portion of a memory cycle to provide partial select X write currents of a polarity opposite the X read currents through two of the selected X conductors simultaneously.

4. The core memory according to claim 1 above, wherein Y decoder circuitry includes a plurality of drive switch pairs, and means for closing one switch pair to pass a pair of Y currents therethrough in response to at least one address signal.

5. The core memory according to claim 4 above, wherein the Y decoder circuitry includes a plurality of Y sink switches arranged to couple a selected pair of Y conductors to a supply voltage, the selected pair being determined in response to at least one address signal.

6. The core memory according to claim 5 above, wherein the Y drive switch pairs and Y sink switches are positioned on opposite sides of the memory cores and connected so that each Y drive switch pair couples more than one pair of Y conductors and each Y sink switch couples more than one pair of Y conductors with the closure of one drive switch pair and one sink switch uniquely selecting one pair of Y conductors.

7. The core memory according to claim 6 above, further comprising a *pair of* current [source] *sources* coupled to the plurality of [sink] *drive* switch pairs to limit the magnitude of current in a selected pair of Y conductors.

8. The core memory according to claim 7 above, wherein the sense amplifier circuit is coupled to sense core switching voltage signals at the current [source] *sources.*

9. The core memory according to claim 8 above, wherein the sense amplifier circuit includes means for rejecting a pedestal differential voltage appearing across the pair of Y conductors at the current source.

10. The core memory according to claim 9 above, wherein the sense amplifier circuit further includes means for blocking large changes in pedestal voltage levels of signals appearing on a selected pair of Y conductors at the current source during a nonread portion of a memory cycle.

11. The core memory according to claim 1 above, wherein the X decoder circuitry includes a plurality of X drive switches coupled to the X conductors and a plurality of X sink switches coupled to the X conductors opposite the X drive switches, the X drive and sink switches being coupled such that one X drive switch and one X sink switch uniquely select one X conductor while simultaneous selection of two X drive switches and two X sink switches uniquely select a pair of X conductors.

12. The core memory according to claim 11 above, wherein the plurality of memory cores are arranged on zeroth, first, second and third frames each containing a plurality of pairs of memory cores inductively coupled by different X conductors for each frame and a single set of Y conductor pairs inductively coupled to cores in all of the frames, wherein the X drive switches are arranged in first and second selectable X drive switch groups with X drive switches in the first selectable group being coupled to X conductors of the zeroth and second frames and with X drive switches of the second selectable group being coupled to X conductors of the first and third frames, and wherein the X sink switches are arranged in third and fourth selectable groups with X sink switches in the third selectable group being coupled to X conductors in the zeroth and first frames and X sink switches in the fourth selectable group being coupled to X conductors of the second and third frames.

13. The core memory according to claim 11 above, wherein the X drive switches are arranged in first and second groups for conducting current in first and opposite directions and wherein the X drive switches within each group are arranged in a matrix for selection by one of a first set of selection signals in coincidence with one of a second set of selection signals.

14. The core memory according to claim 13 above, wherein the X decoder circuitry further includes for each of the first and second groups a first decoder circuit coupled to select one of the first set of selection signals in response to memory address information and a second decoder circuit coupled to select one of the second set of selection signals in response to memory address information.

15. A *2-wire* core memory *with balanced read and write disturbed delta noise along each digit-sense conductor* comprising a plurality of memory cores which are bidirectionally switchable between two different states of magnetization in response to coincident switching currents inductively coupled thereto, a plurality of conductors *including a plurality of digit-sense conductors and a plurality of X conductors orthogonal thereto, the conductors being* arranged to inductively couple current therein to a plurality of memory cores to control the switching of a core in response to the coincidence of current in [at least] two conductors, and current control circuitry coupled to control the current in the plurality of conductors *during a memory cycle* to provide [a first current in a first conductor which remains continually energized while second and third currents are sequentially initiated in different second and third conductors respectively, each of the currents in the second and third conductors being coincident with the current in the first conductor to provide coincident switching current inductively coupled to sequentially switch at least two cores] *selective switching of the memory cores between different states of magnetization, the current control circuitry operating during each memory cycle to provide current in at least two different X conductors with the last currents in the selected X conductors during a memory cycle occurring in opposite read/write polarity pairs such that at the end of a memory cycle half of the last currents in X conductors selected during the memory cycle inductively couple a core along any given digit-sense conductor with a read polarity and half of the last currents in X conductors selected during the memory cycle inductively couple a core along the given digit-sense conductor with a write polarity.*

16. A core memory comprising:

a plurality of magnetic memory cores [including first and second cores] which are bidirectionally switchable between two different states of magnetization in response to the coincidence of at least two partial select currents coupled thereto;

a plurality of conductors arranged to enable the selective switching of each core in response to partial select currents in the conductors, the plurality of conductors including [a first conductor inductively coupling current therein to the first and second cores, a second conductor inductively coupling current therein to the first core and not the second core, and a third conductor inductively coupling current therein to the second core and not the third core,] *a plurality of digit-sense conductor pairs having a given polarity of read current and an opposite polarity of write current and a plurality of X conductors disposed orthogonally to the digit-sense conductors with a pair of cores being disposed at each intersection of a digit-sense conductor pair and an X conductor and being oriented such that a current through the X conductor which inductively couples one core of the pair with a read polarity will inductively couple the other core of the pair with a write polarity;* and current control circuitry coupled to provide partial select currents in the plurality of conductors to selectively switch the cores, the current control circuitry being operable during [a memory cycle to continuously provide partial select current in the first conductor while providing partial select currents in the second and third conductors to provide coincident switching currents at the first and second cores which tend to induce switching of the first and second cores in a time sequence enabling a single sense amplifier to sense the switching of both cores] *each memory cycle to provide partial select currents through selected digit-sense conductor pairs and a plurality of selected X conductors to control the switching of selected memory cores, the last currents through the selected X conductors during each memory cycle having a direction such that half of the last X currents inductively couple the cores coupled by a given digit-sense conductor with a read polarity and half of the last X currents inductively couple the cores coupled by the given digit-sense conductor with a write polarity so that at the end of each memory cycle the cores along any given digit-sense conductor which last receive a partial select read disturb X current during the memory cycle are match paired by cores along the given digit-sense conduct which last receive a partial select write disturb current during the memory cycle to tend to cause equal delta noise to appear on each digit-sense conductor of each digit-sense conductor pair when subsequently selected during a read portion of a memory cycle.*

17. A core memory comprising:

a plurality of magnetic memory cores which are switchable between two stable states of magnetization in response to the coincidence of partial select currents inductively coupled thereto, the cores including first, second, third and fourth cores;

a plurality of conductors arranged to enable the selective switching of each core in response to partial select currents in the conductors, the plurality of conductors including a first conductor inductively coupling current therein to the first and third cores, a second conductor inductively coupling current therein to the second and fourth cores, a third conductor inductively coupling current therein to the first and second cores, and a fourth conductor inductively coupling current therein to the third and fourth cores; and current control circuitry coupled to provide partial select currents in the plurality of conductors to selectively switch the cores, the current control circuitry being operable to continuously maintain partial select currents in the first and second conductors during a memory cycle while providing partial select currents in the third and fourth conductors, the inductive coupling of the cores by the currents in the first, second, third and fourth currents being such that the currents in the third and fourth conductors are each coincident with a different one of the currents in the first and second conductors and anticoincident with the other.

18. The core memory according to claim 17 above, wherein the current control circuitry is operable during a write portion of a memory cycle to provide the currents in the third and fourth conductors simultaneously.

19. The core memory according to claim 18 above, further comprising first and second switches coupled in series with the first and second conductors to selectively enable and disable current in the first and second conductors in response to data information during a write portion of a memory cycle.

20. The core memory according to claim 17 above, wherein during a read portion of a memory cycle the currents in the third and fourth conductors are initiated sequentially, and further comprising means for sensing core switching signals appearing on the first and second conductors during a read portion of a memory cycle.

21. The core memory according to claim 20 above, wherein during a write portion of a memory cycle partial select currents are generated in the third and fourth conductors simultaneously and further comprising means for selectively inhibiting partial select currents in the first and second conductors in response to data information.

22. The core memory according to claim 20 above, wherein the currents in the third and fourth conductors are provided simultaneously during part of a read portion of a memory cycle.

23. A core memory comprising:

a plurality of groups of magnetic memory cores which are switchable between two stable states of magnetization;

a plurality of Y conductors, each inductively coupled to a mutually exclusive Y subgroup of cores from each group;

a plurality of X conductors for each group of cores, each X conductor being inductively coupled to a mutually exclusive X subgroup of cores from one group, with each X subgroup including one core from each Y subgroup of cores of said one group; and control circuitry coupled to execute a memory cycle during which a multibit data word is read from or written into a multiple core, memory word location *having at least one core within each group and defined by* a single address, said memory cycle being executed in a plurality of time sequential memory subcycles with a [different] portion of the multibit data word *within a different group* being read from or written into said defined memory word location during each memory subcycle.

24. The core memory according to claim 23 above, wherein each group of cores is configured as a 2 wire $2\frac{1}{2}$D memory plane with the Y subgroups forming Y subgroup pairs that are inductively coupled such that when a pair of Y partial select currents are passed through the pair of Y conductors corresponding to a Y subgroup pair and an X partial select current is passed through an X conductor, the X current inductively couples a core in one Y subgroup of said pair with a polarity the same as the Y current coupled thereto and inductively couples a core in the other Y subgroup of said pair with a polarity opposite to the Y current coupled thereto.

25. A core memory comprising;

at least four groups of magnetic memory cores which are switchable between two stable states of magnetization;

a plurality of Y conductors, each inductively coupled to a mutually exclusive Y subgroup of cores from each group;

a plurality of X conductors for each group of cores, each X conductor being inductively coupled to a mutually exclusive X subgroup of cores from one group, with each X subgroup of cores including one core from each Y subgroup of cores of said one *group*, the X conductors for each group of cores each having a drive end and an opposite sink end with the drive ends coupled in X drive subgroups having the drive ends of all X conductors within each X drive subgroup coupled in common and with the sink ends coupled in X sink subgroups having the sink ends of all X conductors within each X sink subgroup coupled in common and with the X drive and sink subgroups arranged such that each X drive subgroup includes one X conductor from each X sink subgroup and each X sink subgroup includes one X conductor from each X drive subgroup; and control circuitry coupled to execute a memory cycle during which a multibit data word is read from or written into a multiple core, memory word location defined by address information, said memory cycle being executed in a plurality of time sequential memory subcycles with a different portion of the multibit data word being read from or written into said defined memory word location during each memory subcycle, the control circuitry including (1) X drive decoder circuitry coupled to enable the passage of a partial select current in a commanded direction through the X conductors of a defined X drive subgroup from each group within a commanded one of two drive super groups each of which includes two different groups, the X drive subgroup being defined by an X drive portion of the address information, (2) X sink decoder circuitry coupled to enable the passage of a partial select current of a commanded direction through the X conductors of a defined sink drive subgroup from each group within a commanded one of two X sink super groups each of which includes a different group from each X drive super group, the sink drive subgroup being defined by an X sink portion of the address information, and (3) sequence and timing circuitry coupled to command a direction of current through the X drive decoder circuitry and X sink decoder circuitry, command selection of one of two X drive super groups and command selection of one of two X sink super groups.

26. A core memory comprising:

at least two arrays of memory cores which are switchable between two stable states of magnetization, each array containing a plurality of orthogonal rows and columns of cores permitting unique identification of a core within an array by a row position and a column position;

a plurality of Y conductors, each Y conductor being inductively coupled to all of the cores in one column of cores in each array;

a plurality of X conductors, each X conductor being inductively coupled to one row of cores in one array, each array having a plurality of rows of cores inductively coupled by X conductors;

Y decoder circuitry coupled to select at least one Y conductor to the exclusion of other Y conductors in response to memory address information;

X decoder circuitry coupled to select exactly one X conductor from each array in response to memory address information;

current control circuitry coupled to operate during a memory read cycle to continuously pass a partial select switching current through the at least one Y conductor selected by the Y decoder circuitry while passing partial select switching currents through the X conductors selected by the X decoder circuitry, the partial select currents through each X conductor being initiated at a different time; and sense amplifier circuitry coupled to sense core switching signals appearing on the Y conductors during a memory read cycle and sequentially indicate the presence or absence of a core switching signal following each initiation of a partial select current through each different X conductor.

27. A core memory arranged to read and write a multiple bit data word at a word address location selected from a plurality of word address locations in response to address information, the word being divided into a plurality of different portions with different portions being read from or written into the memory at different, sequential time intervals, the memory including means for generating at least one partial select current that remains continuously active during at least two consecutive sequential time intervals during which different *multiple bit* portions of the word are read from or written into the memory.

28. A core memory comprising:

a plurality of multibit shift registers, each having a shift input, a plurality of parallel inputs coupled to receive data in parallel and a plurality of parallel outputs coupled to provide data in parallel; each shift register being coupled to shift therein a plurality of data signals received sequentially from a sense amplifier during a memory read operation;

a plurality of multiplexers, each being coupled to receive data from the parallel outputs of a shift register and to output a selectable two data signals in response thereto;

a plurality of Y current sources coupled to provide a pair of Y read currents during a memory read operation and a pair of opposite polarity Y write currents during a memory write operation;

a plurality of sets of Y drive decoder switches, each being arranged to couple a pair of Y currents from a current source to an address selected pair of Y drive switch conductors respectively, and each including a pair of Y series switches, each Y series switch being coupled to selectively [unhibit] *inhibit* a different write current in response to a different one of the data signals from a multiplexer;

a plurality of sense amplifiers, each being coupled to sense core switching voltage signals superimposed upon a pair of Y read currents at a current source [therefore] *therefor* and communicate a sequence of data signals indicative of sensed core switching voltage signals to a shift input of a shift register during a memory read operation;

a plurality of Y decoder diode matrices, each coupling pairs of drive switch conductors from a set of Y drive decoder switches to a plurality of pairs of Y conductor pairs at drive ends thereof;

a plurality of frames of bistable magnetic memory cores, each frame including rows and columns of cores inductively coupled by X conductors having opposite drive and sink ends along the rows and Y conductor pairs having opposite drive and sink ends along the columns with each Y conductor inductively coupling a column of cores from each frame, each pair of cores inductively coupled by an X conductor and a pair of Y conductors being inductively coupled with first and opposite polarities;

a set of Y sink switches arranged to couple the sink ends of a plurality of pairs of address selected Y conductors to a voltage source to enable the passage through all of the core frames of one pair of Y currents for each set of Y drive decoder switches;

a pair of X current sources providing opposite polarity partial select X currents;

a set of X drive decoder switches arranged to couple the X current sources to address selected X drive switch conductors;

an X decoder diode matrix for each frame, each matrix coupling drive ends of X conductors to X drive switch conductors with a plurality of X conductor drive ends being coupled to each X drive switch conductor;

first and second sets of X sink switches each having a plurality of X sink conductors, each coupled to a plurality of X conductors such that selection of the X drive conductor and an X sink conductor uniquely selects an X conductor and each arranged to couple an address selected X sink conductor to a series switch;

first and second pairs of series switches coupling selected X sink conductors of the first and second sets of X sink switches respectively to opposite polarity voltage sources; and timing and control circuitry coupled to control the switches of the core memory to provide during a read operation a pair of continuous partial select Y read currents for each set of Y drive decoder switches and a partial select X read current for each frame, the X read currents being initiated sequentially with each next X read current being initiated after a switching of a core has been sensed for any immediately preceding X read current, and to provide during a write operation the enabling of a pair of partial select Y write currents for each set of Y drive decoder switches and a partial select X write current for each frame with partial select X write currents for pairs of frames being provided in sequence and with the pairs of Y series switches being responsive to different data from the multiplexers while partial select write current passes through each different pair of frames.

29. A core memory sense amplifier circuit comprising:

a differential amplifier having inputs coupled to sense a differential voltage across a pair of conductors and an output coupled to generate an output signal indicative of the differential voltage;

a first capacitor having a first terminal coupled to the output signal of the differential amplifier and an opposite second terminal;

a second capacitor having a first terminal coupled to a constant voltage source and an opposite second terminal;

a circuit coupled to equalize the voltages on the second terminals of the first and second capacitors *by charging each toward the other* before core switching signals are to be sensed and to present a high impedance to the second terminals as core switching signals are sensed; and a comparator coupled to indicate the [occurrance] *occurrence* of a voltage differential across the second terminals greater than a threshold voltage.

30. The core memory sense amplifier circuit according to claim 29 above, further comprising a circuit coupled to limit DC voltage of the differential amplifier inputs.

31. The core memory sense amplifier circuit according to claim 29 above, wherein the circuit coupled to equalize includes a diode bridge circuit having two pairs of series coupled diodes and an enabling circuit coupled to forward bias the diodes before core switching signals are generated and to reverse bias the diodes to provide a high impedance to the second terminals as core switching signals are generated, each pair of series coupled diodes being coupled at its midpoint to a different one of the second terminals of the first and second capacitors.

32. The core memory according to claim 1 above, wherein the X current control circuitry operates during a read portion of a memory cycle to provide a second partial select X read current through a second of the two X conductors after a first core switching voltage signal for a first partial select X read current has been sensed by the sense amplifier circuit and before the first core switching voltage signal has returned to zero.

33. A core memory comprising:

a plurality of magnetic memory cores which are switchable between two stable states of magnetization in response to the coincidence of partial select currents inductively coupled thereto, the cores including first, second, third and fourth cores;

a plurality of conductors [arrnged] *arranged* to enable the selective switching of each core in response to partial select currents in the conductors, the plurality of conductors including a first conductor inductively coupling current therein to the first and third cores, a second conductor inductively coupling current therein to the second and fourth cores, a third conductor inductively coupling current therein to the first and second cores, and a fourth conductor inductively coupling current therein to the third and fourth cores; and current control circuitry coupled to provide partial select currents in the plurality of conductors to selectively switch the cores, the current control circuitry being operable during each cycle of the memory to continuously maintain partial select currents in the first and second conductors while sequentially providing partial select currents in the third and fourth conductors, the inductive coupling of the cores by the currents in the first, second, third and fourth currents being such that the currents in the third and fourth conductors are each coincident with a different one of the currents in the first and second conductors and anticoincident with the other, the third and fourth currents each being coincident with a different one of the first and second currents.

34. The core memory according to claim 33 above, wherein the current control circuitry provides a read/-write cycle in which first, partial select read currents are maintained in the first and second conductors while partial select read currents are provided in the third conductor and then the fourth conductor and second, *partial select write currents are selectively maintained in the first and second conductors in response to data information while* partial select write currents are provided sequentially in the third and fourth conductors.

35. The core memory according to claim 34 above, further comprising a differential sense amplifier having first and second differential inputs coupled to the first and second conductors respectively to sense signals appearing thereon in response to the switching of a core inductively coupled thereto from one stable state to another.

36. A core memory comprising:

a plurality of groups of magnetic memory cores which are switchable between two stable states of magnetization;

a plurality of Y conductors, each inductively coupled to a mutually exclusive Y subgroup of cores from each group, said Y conductors being grouped into pairs of Y conductors across which core switching signals are differentially sensed;

a plurality of X conductors for each group of cores, each X conductor being inductively coupled to a mutually exclusive X subgroup of cores from one group, with each X subgroup including one core from each Y subgroup of cores of said one group; and control circuitry coupled to execute a memory cycle during which a multibit data word is read from or written into a multiple core, memory word location defined by address information, said memory cycle being executed in a plurality of time sequential memory subcycles with a different portion of the multibit data word being read from or written into said defined memory word location during each memory subcycle, a plurality of said cores of a memory word being inductively coupled by a pair of Y conductors with each core of said plurality being in a different group with half of said plurality of cores being inductively coupled by one of the pair of Y conductors and the other half being inductively coupled by the other of the pair of Y conductors.

37. A core memory comprising:

at least one pair of groups of magnetic memory cores which are switchable between two stable states of magnetization;

a plurality of Y conductor pairs, each Y conductor inductively coupled to a mutually exclusive Y subgroup of cores from each group;

a plurality of X conductors for each group of cores, each X conductor being inductively coupled to a mutally exclusive X subgroup of cores from one group, with each X subgroup including one core from each Y subgroup of cores of said one group, each X conductor inductively coupling the cores of pairs of Y subgroups corresponding to Y conductor pairs in first and opposite orientations; and control circuitry coupled to execute a memory cycle during which a multibit data word is read from or written into a multiple core, memory word location defined by address information, said memory cycle being executed in a plurality of time sequential memory subcycles with a different portion of the multibit data word being read from or written into said defined memory word location during each memory subcycle with each pair of Y conductors having one Y conductor inductively coupling a core for a memory word in one group of a pair of groups also having the Y conductor opposite the one Y conductor of the pair of Y conductors inductively coupling a core of the memory word in the group opposite the one group in the pair of groups of memory cores.

38. The core memory according to claim 37 above, further comprising a differential sense amplifier coupled to sense differential voltages appearing across a selected pair of Y conductors.

39. A magnetic core memory comprising an array of magnetic memory cores inductively coupled by word conductors and digit-sense conductor pairs carrying electrical signals controlling and sensing magnetic switching of the memory cores, the currents through the [work] *word* conductors including partial selection read and write currents; and control circuitry coupled to the word and digit-sense conductors to provide currents through the array during a memory cycle to magnetically switch selected cores in the array, with unselected cores coupled along any given *unselected* digit-sense conductor which receive a partial selection word conductor current appearing in pairs of cores which receive last partial selection word conductor currents during a memory cycle in opposite read or write directions.

40. The core memory according to claim 39 above, further comprising at least one sense amplifier coupled to sense core switching signals appearing across a pair of [digitsense] *digit-sense* conductors during a memory cycle.

41. A magnetic core memory comprising a plurality of generally parallel spaced pairs of digit conductors, each pair being coupled to carry digit current therethrough in a given direction; a plurality of word conductors extending generally perpendicular to the pairs of digit conductors and coupled to carry word current therethrough, a plurality of magnetic memory cores each inductively coupling a unique combination of one digit conductor and one word conductor, any pair of cores which inductively couple a single word conductor and the digit conductors of a pair of digit conductors doing so with opposite relative coincidences such that only one core of the pair of cores experiences coincident word and digit currents at any given time; and control circuitry coupled to control currents through the word conductors and pairs of digit conductors to provide memory cycles for the storage and retrieval of information in the memory, each memory cycle including word currents in pairs of word conductors with the last current in one word conductor of a pair during a memory cycle inductively coupling a core along a given Y conductor in a first read or write sense and with the last current in the other word conductor of the pair inductively coupling a core along the given Y conductor in a read or write sense opposite the first sense.

*42. The core memory according to claim 15 above, wherein the digit-sense conductors are connected in pairs and the current control circuitry drives the conductors of*

*selected digit-sense conductor pairs with balanced currents during a memory cycle.*

*43. The core memory according to claim 15 above, wherein the current control circuitry includes sink and driver circuitry providing the word currents with the opposite polarity last currents being provided by coupling the X conductors carrying the currents to sink circuitry providing respectively opposite polarity voltages.*

* * * * *